（12) United States Patent
Everett et al.

(10) Patent No.: US 7,143,321 B1
(45) Date of Patent: Nov. 28, 2006

(54) SYSTEM AND METHOD FOR MULTI PROCESSOR MEMORY TESTING

(75) Inventors: Gerald L Everett, Alta, CA (US); Kent A Dickey, Westford, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/561,813

(22) Filed: Apr. 29, 2000

(51) Int. Cl.
*G11C 29/00* (2006.01)

(52) U.S. Cl. .................. 714/718; 714/723; 714/42; 714/36

(58) Field of Classification Search ........ 714/718–720, 714/723, 724, 733, 11, 38, 25, 30, 31, 34, 714/36, 42, 47, 49, 54, 764, 702, 805, 755; 711/200–206, 147, 153, 209, 221; 700/82; 365/201, 189.01, 230.01, 230.03
See application file for complete search history.

(56) References Cited

U.S. PATENT DOCUMENTS

| 4,972,416 | A | * | 11/1990 | Nagai et al. ................. 714/755 |
| 5,233,614 | A | * | 8/1993 | Singh .......................... 714/723 |
| 5,673,388 | A | * | 9/1997 | Murthi et al. ................. 714/42 |
| 6,480,982 | B1 | * | 11/2002 | Chan et al. ................. 714/764 |

\* cited by examiner

*Primary Examiner*—Guy J. Lamarre

(57) ABSTRACT

A method for testing the memory in a system with two or more processing units is provided that generally involves the following acts. The memory is divided into two or more sections—one for each of the two or more processing units. Thus, each processing unit has an associated memory section. The memory is then checked with each memory section being checked with its associated processing unit. The act of checking the memory includes causing the address of a first encountered faulty location to be stored and causing a flag to be set in response to encountering a second faulty location. Finally, it is determined whether the flag has been set after the memory is checked. If so, a walk-through routine is then performed.

17 Claims, 1 Drawing Sheet

SYSTEM AND METHOD FOR MULTI PROCESSOR MEMORY TESTING

TECHNICAL FIELD

The present invention relates generally to memory test systems and methods. In particular, the present invention relates to a system and method for testing the memory in a multi-processor computer.

BACKGROUND

Super-scalar computers and other computing devices include cells that each have one or more processing units (PUs) and memory for the cell. In connection with booting a cell, its memory must be checked for faulty locations so that such locations can be bypassed by the operating system executed by the cell. Typically, faulty location addresses are logged in a page de-allocation table ("PDT"), which is provided to the operating system so that the faulty locations can be avoided.

Generally speaking, memory tests fundamentally involve writing data (e.g., pseudo random pattern) to the memory, reading the data back, writing the complement of the data, and finally, reading the complement data. The read data is compared with the previously written data to determine whether they are the same indicating that the memory is healthy. This method effectively checks every bit in the memory system. It has been implemented in several ways, but essentially there are two conventional schemes: full comparison and machine check.

The full comparison method consists of one or more processors checking (writing/reading) the memory on a word by word basis. It is very thorough, but it is relatively slow. With this method, all processors can be used to check a separate block of the memory. However, with every-increasing memory size, even such a parallel implementation of the method can be excessively slow.

The machine check method uses a machine check handler, which carries out the actual memory error processing. Machine check handlers are normally included as part of conventional memory systems (e.g., within the operating system). A processor initiates the memory check handler, which generates an interrupt to the processor when a faulty location is encountered so that it may be logged by the processor. Typically, only a single processor is used with this mechanism because with multi-processor designs require excessively complex firmware (i.e., boot up routine). The single processor scheme functions adequately, but it fails to take advantage of the multiple processor resources available to a cell.

Accordingly, what is needed is an improved memory test method that can exploit the availability of multiple processors for implementing the test.

SUMMARY OF THE INVENTION

These and other objects, features and technical advantages are achieved by a system and method that efficiently tests memory with multiple processors in a parallel fashion. A method for testing the memory in a system with two or more processing units is provided that generally involves the following acts. The memory is divided into two or more sections—one for each of the two or more processing units. Thus, each processing unit has an associated memory section. The memory is then checked with each memory section being checked with its associated processing unit. The act of checking the memory includes (i) causing the address of a first encountered faulty location to be stored, and (ii) causing a flag to be set in response to encountering a second faulty location. Finally, it is determined whether the flag has been set after the memory is checked. If so, a walk-through routine is then performed.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawing, in which.

DETAILED DESCRIPTION

Figure 1:
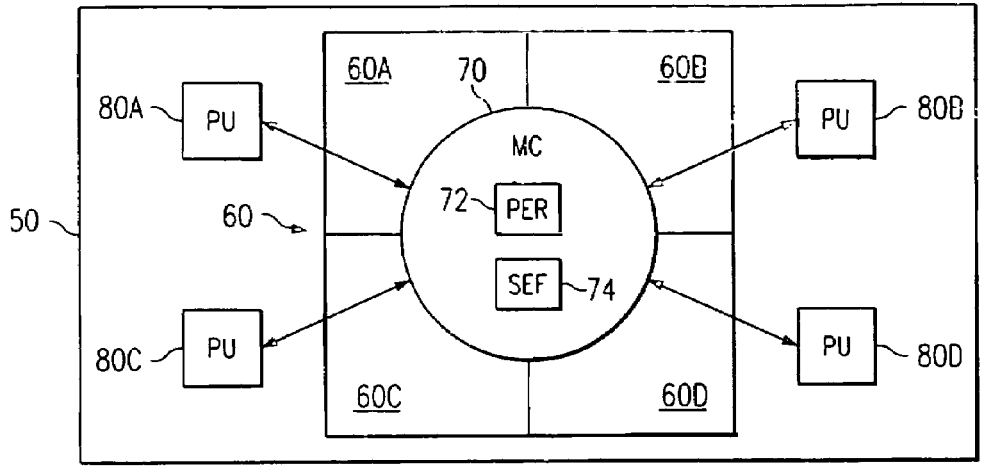
FIG. 1 is a block diagram of a cell that can implement the memory test method.

FIG. 1 shows a cell 50 configured to implement one embodiment of the present invention. In the depicted embodiment, cell 50 corresponds to an I64 architecture cell card for a super scalar computer system.

Cell 50 generally includes memory 60, memory controller 70, and processing units 80A through 80D. Among other things, memory controller 70 has primary error register ("PER") 72 and a secondary error flag ("SEF") 74. Each of the processing units, 80A through 80D, is operably connected to the memory controller 70. In turn, the memory controller 70 is operably connected via a bus (not shown) to memory 60 for providing read/write access thereto. Thus, each processing unit accesses the memory through memory controller 70.

In the depicted embodiment, the memory 60 has been conceptually parsed into four sections 60A, 60B, 60C, and 60D—one for each processing unit. Each processing unit is assigned an associated memory section to execute a memory check (e.g., complementary write/read comparison) as part of the memory test method, which will be discussed in greater detail below. A memory check is performed by a processor through the memory controller 70. A memory check (or "checking" memory) refers to any suitable scheme for identifying a faulty memory location in the memory. In one embodiment, it corresponds to conventional write/read and complementary write/read memory sweeps.

When the memory 60 is checked, if a first error (faulty location) is encountered, the address of this location is stored in the PER 72. If a second error is encountered, the SEF 74 is set and remains set regardless of whether any additional errors are encountered. Thus, the SEF 74 indicates whether 2 or more faulty locations exist in the memory for which the memory check was performed. The memory controller 70 can simultaneously service the processing units. Therefore, the processing units can check in parallel their associated memory sections.

In one embodiment, the memory test is employed at system boot-up. When the system boots up, a designated "Monarch" processor controls the memory test. The other processors are designated as slaves, and they go into a very tight loop and wait for an interrupt. While in this loop, they are said to be "asleep". When the monarch wants them to do something, it generates this interrupt. The slave processors then go to a known location and get an address of a procedure that they are to run. Thus, a memory check for each section occurs with the monarch writing the address of the memory check code into a known location and waking up the slaves by sending them an interrupt. They wake up, vector to the memory check code, and execute it. The processors check their section of memory without regard to errors (i.e., their interrupts are disabled from the memory controller 70). When finished, they go back to sleep. The monarch, which during the memory check acted like the slave processors, comes back and examines the PER 72 and SEF74. It checks first to see if a primary error occurred. If so, it logs that error (in the page deallocation table). It then checks the SEF to determine if there was a secondary error. If the monarch finds that a secondary error has been flagged, it executes a walk-through routine (discussed below) to find and log the errors for the entire memory 60.

Figure 2:
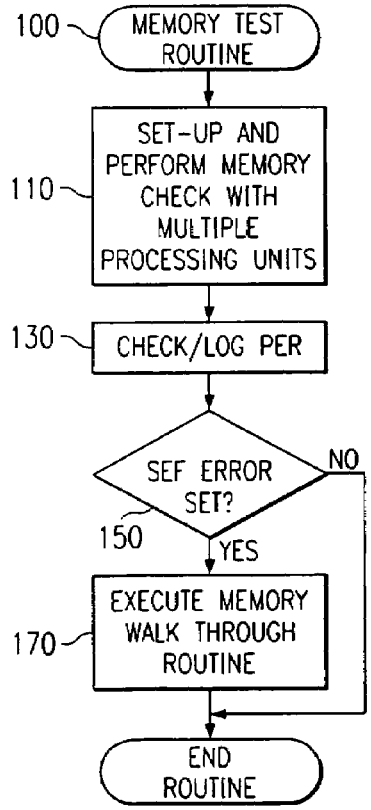
FIG. 2 is a flow diagram of one embodiment of a memory test routine.

FIG. 2 shows one embodiment of a memory test routine 100 of the present invention. Routine 100 generally includes set-up and performing a memory check on the memory 60 with the multiple processing units 80 at step 110. The PER 72 is then checked and logged (if written to) at 130 by one of the processing units (e.g., a monarch processing unit). The processing unit then checks the secondary error flag (SEF) 74 at step 150. If the SEF has been set (indicating that more than one error was encountered), the processing unit executes a walk-through routine on the memory at 170. Otherwise, the memory test routine 100 is completed.

If the SEF was not set, then implicitly, a maximum of one faulty location is present in memory 60; and that location's address will be stored in the PER 72 and logged in the page deallocation table. On the other hand, if the walk through routine at 170 is executed, all of the two or more faulty locations are discovered and logged by the processing unit (e.g., monarch) executing the routine. Even though the walk-through routine is relatively slow as compared with the parallel processed memory check, the overall memory test routine 100 is fast and effective because memory 60 will normally only have one or less faulty locations.

In one embodiment, memory test routine 100 is performed several times—each time using a different memory check scheme. For example, the first time, a write/read sweep could be used, and the second time, the complementary write/read sweep is used. This embodiment will now be described.

A monarch/slave parallel processing scheme is implemented with processing units (processors) 80 in cell 50. The monarch processor (which is determined by the boot up firmware within the cell) initially initializes the memory controller 70. It then performs an initialization of the boundaries on the memory controller and then executes a detailed initialization of the memory controller 70 for the first memory test 100 pass (write/read memory check). With this memory test pass, the PER and SEF are cleared and random data is written and read back through memory. The random writing/reading is done by each processing unit on its associated memory section with all interrupts off (i.e., all errors are ignored). This is because the memory is not in any known state. The slaves and monarch go through their sections, which the monarch had allocated in the initial setup. When finished, the slaves go back and wait for a state change signal from the monarch to begin the second (complementary) memory test pass. This will occur either after the monarch has determined that the SEF was not set or has performed a walk through routine.

The processors during the second pass through memory read the data that was written in the first pass and write back the compliment of that data. The monarch sets up for this and wakes the slaves to do the second pass through memory. When finished, the slaves go back to rendevous or rendezvous, and the monarch checks the PER and SEF.

In another version of this embodiment where two memory tests (write/read check and complementary write/read check) are performed, three rather than two sweeps are used. Initially, the PER and SEF are cleared and the monarch causes the processing units to write the random data through memory. Then, the monarch causes the processors to read back the data in the next memory sweep, which fills the PER and sets the SEF if more than one bad location exists. Also, in this sweep, it causes the processors to write complementary data in to the memory before going back to sleep. It then clears the PER and SEF and causes the processors to read the complementary data in a third sweep. In this version, three sweeps are used to perform 2 memory test routines 100 for the two different memory check types.

Figure 3:
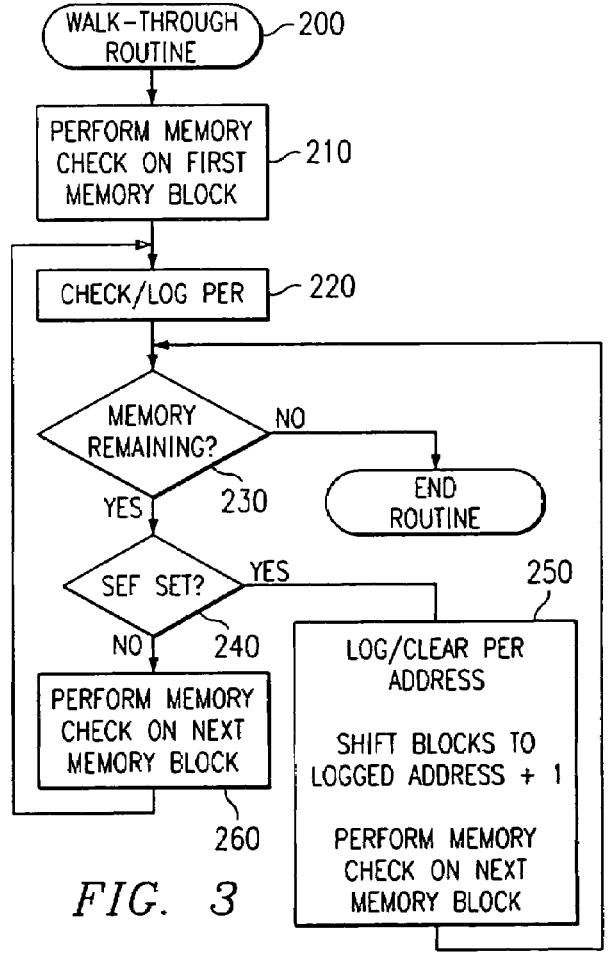
FIG. 3 is a flow diagram of one embodiment of a walk-through routine

FIG. 3 shows one embodiment of a walk-through routine 200. Initially, a memory check is performed on a first block of memory at step 210. The PER is then checked and logged at 220. At 230, it is determined whether unchecked memory is left (i.e., the memory has not all been checked). If unchecked memory still remains, then the SEF is checked at 240. If not set, then a memory check is performed on the next memory block at step 260. From here, the routine loops back to step 220 and continues as previously described. If the SEF was set at 240, then at 250, the following acts are performed. The PER is logged and cleared; the blocks are shifted downward so that the "next" block begins at the location just after that stored in the PER; and a memory check is performed on this next block. From here, the routine proceeds to step 230 and continues as described. The routine ends when at step 230, it is determined that all of the memory has been checked.

Thus, the monarch "walks" through memory a block at a time and as long as it only finds 1 (or less) errors in each of the pre-defined blocks, it sequentially proceeds through the memory without having to shift the block definitions. On the other hand, if it turns out that more than one error exists in a block, the monarch goes back and tests from just ahead of the primary faulty location (stored in PER) as the beginning of the next block pass. This corresponds to block shifting. It allows the monarch by using blocks of memory to test the memory in a reasonably fast fashion.

As used above, a block is a portion of the overall memory. Block size is the size of the block that the monarch will test before checking the PER and SEF as it sequentially goes through the memory to find multiple bit errors. (In this embodiment, single bit errors are handled by the memory controller and not deemed problematic.) In implementing routine 200, the block size should be optimally determined for the system and memory being tested. An optimal block size is large enough so that the routine proceeds quickly through the memory (less blocks needed and thus fewer memory check sweeps) and yet small enough so that excessive errors are not encountered in each block. In one embodiment, it was found that 100 megabyte blocks were optimal for a 2 giga-byte or larger memory 60.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for testing memory in a system with two or more processing units, said method comprising the steps of:
   dividing memory into two or more sections, wherein each of the two or more processing units has at least one associated memory section
   checking the memory by checking each memory section with its associated processing unit, wherein the act of checking the memory includes causing the address of a first encountered faulty location to be stored and causing a single flag to be set once in response to encountering one or more subsequent faulty locations;
   determining whether the single flag has been set after the memory is checked; and
   implementing a walk-through routine if the single flag is set.

2. The method of claim 1 wherein the memory sections are checked in parallel by the processing units.

3. The method of claim 1 wherein the walk-through routine is implemented with a single one of the two or more processing units.

4. The method of claim 1 wherein the system has a memory controller for accessing the memory, the address of the first encountered faulty memory location being stored in a register of the memory controller.

5. The method of claim 1 wherein the walk-through routine includes:
   (i) dividing the memory into sequential memory blocks,
   (ii) checking a first block of memory, wherein the act of checking the first memory block includes causing the address of a first encountered faulty location to be stored and causing the single flag to be set in response to encountering a second faulty location,
   (iii) if encountered, logging the stored faulty address location,
   (iv) if the single flag was not set, repeating steps ii and iii on the next memory block,
   (v) if the single flag was set, shifting the memory blocks so that the next memory block begins with the memory location after the logged first encountered faulty memory location and repeating steps ii through v on the next memory block, and
   (vi) performing steps ii through v until all of the memory has been checked.

6. The method of claim 5 wherein the size of a block is substantially proximal to one hundred million bytes.

7. The method of claim 1 wherein the memory is divided into equal sections, one for each of the two or more processing units.

8. The method of claim 1 arranged to operate as part of a boot up routine for testing memory.

9. The method of claim 8 arranged to operate as part of a computer.

10. A memory storage device in a system having two or more processing units and a memory, the storage device having instructions that when executed perform a method comprising:
    dividing the memory into sections with each section having an associated processing unit;
    checking the memory by checking each memory section with its associated processing unit, wherein the act of checking the memory includes causing the address of a first encountered faulty location to be stored and causing a single flag to be set once in response to encountering one or more subsequent faulty locations;
    determining whether the single flag has been set after the memory is checked; and
    implementing a walk-through routine if the single flag is set.

11. The method of claim 10 wherein the memory sections are checked in parallel with the two or more processing units.

12. The method of claim 10 wherein the walk-through routine is implemented with a single one of the two or more processing units.

13. The method of claim 10 wherein the system has a memory controller for accessing the memory, the address of the first encountered faulty memory location being stored in a register of the memory controller.

14. The method of claim 10 wherein the walk-through routine includes:
    (i) dividing the memory into sequential memory blocks,
    (ii) checking a first block of memory, wherein the act of checking the first memory block includes causing the address of a first encountered faulty location to be stored and causing the single flag to be set in response to encountering a second faulty location,
    (iii) if encountered, logging the stored faulty address location,
    (iv) if the single flag was not set, repeating steps ii and iii on the next memory block,
    (v) if the single flag was set, shifting the memory blocks so that the next memory block begins with the memory location after the logged first encountered faulty memory location and repeating steps ii through v on the next memory block, and
    (vi) performing steps ii through v until all of the memory has been checked.

15. The method of claim 10 wherein the memory is divided into equal sections, one for each of the two or more processing units.

16. A computer cell comprising:
    memory with an associated memory controller for accessing the memory, the memory controller having a primary error register for storing the location of a faulty address and a single secondary error flag for indicating when set that at least two faulty locations exist in the memory; and
    two or more processing units for testing the memory, wherein the two or more processing units check the memory by checking different memory sections in parallel with one another with their interrupts turned off with respect to the memory controller, cause the memory controller to store the address of an encountered faulty memory location in the primary error register, cause the single secondary error flag to be set if an additional faulty memory location is encountered, and execute with one of the processing units a walk-through routine if the single secondary error flag is set.

17. A computer cell of claim 16 wherein:

the cell is a component of a computer system.

* * * * *